June 15, 1965 A. F. PODELL 3,189,836
MIXER EMPLOYING DUAL DIODE CIRCUIT BIASED IN
THEIR EXPONENTIAL OPERATING REGIONS
Filed May 22, 1962

INVENTOR.
ALLEN F. PODELL
BY
Robert Ames Norton
ATTORNEY 3,189,836
Patented June 15, 1965

3,189,836

MIXER EMPLOYING DUAL DIODE CIRCUIT BIASED IN THEIR EXPONENTIAL OPERATING REGIONS

Allen F. Podell, Old Greenwich, Conn., assignor to Anzac Electronics, Incorporated, Stamford, Conn., a corporation of Connecticut Filed May 22, 1962, Ser. No. 196,727
3 Claims. (Cl. 328—156)

Figure 1:
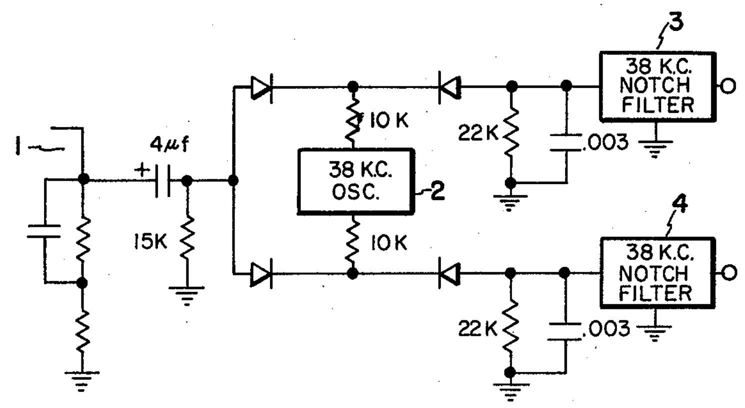

This invention relates to opposed connected diode circuits having improved switching and mixing characteristics.

The problem of switching outputs and of mixing signals of two frequencies are frequently encountered in electronic circuits. For these purposes it has been proposed to use pairs of diodes connected in opposition, that is back to back or front to front. Such a pair has three points at which inputs or outputs can be connected, namely the two ends of the diodes and the junction between them. In switching it is customary to connect the signal to be switched and the switch control signals to the two ends of the diodes and the output to their center connection, but there is one proposal described in Patent 2,959,690 in which diodes arranged in opposed connections have been used with the switching control signals connected between the diodes. In this case, however, the same switching controls are connected in reverse phase to the output from one diode, the input signals going to the other. This has required fairly complex circuits utilizing either vacuum tubes or a complex diode bridge. The reason for these circuits is to eliminate switch signal frequency from the output. When properly designed these switch circuits operate satisfactorily. However, they require a large number of elements.

In one phase of the present invention it has been found that with suitable choice of circuit element values and a simple filter in the output circuit the same degree of freedom from switching signal frequency in the output is obtained with fewer elements and in a simpler circuit. The simple circuits referred to are SPST switches. If an SPDT is needed, two pairs of diodes and two filters are required. This latter is of particular value in FM multiplex adapters and multiplex circuits. It is an advantage of this phase of the invention that expensive, accurately center tapped transformers with perfect balance are not necessary. Essentially the improved results of the present invention as a switcher are obtained by using a source of input signals with an impedance very much less than the output impedance of the switch output circuits. For example, with an impedance difference of 100 to 1 a simple filter in the output circuit or circuits will eliminate switching signal frequency to practically the same degree as the complex circuits of the patent above referred to, with a saving of a number of components and using only components of high stability, such as resistors and capacitors rather than tubes and diodes.

A second phase of the invention is the use of a diode pair as a mixer with one frequency entering the end of one diode, and the other frequency in the junction between the diodes and the output at the end of the other diode. Neither frequency source requires accurate balancing to ground. In fact they may each be connected with one side to ground. The results are substantially perfect mixing. With the more ordinary construction where the two signals are introduced at the ends of the diodes, and the output taken from the center connection in order to approach the quality obtainable by the present invention one of the signal sources must be very carefully balanced with respect to ground. If, in use, the balance is lost one signal will get into output reducing signal to noise ratio.

Very cheap and simple circuits for mixing are obtained which, with a suitable choice of diodes, may have an enormous range of current for satisfactory mixing. For example, as will be described below, a range of 400,000 to 1.

Figure 2:
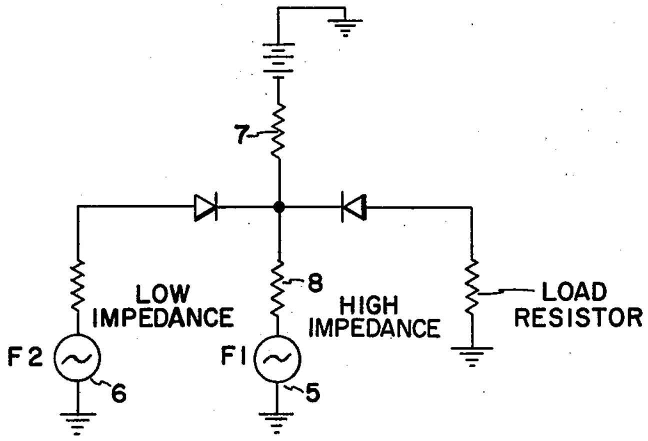

The invention will be described in greater detail in conjunction with the drawings, in which:

FIG. 1 is a schematic, partly in block form, of a SPDT switch for an FM multiplex adapter, and FIG. 2 is a partial schematic of a mixing circuit.

In FIG. 1 the input signal 1 comes from the tuner of an FM set through its cathode follower. The source of switching signals shown on 2 is an ordinary 38 kc. synchronized oscillator. The filters 3 and 4 in the two outputs are conventional filters with a 38 kc. notch.

The impedance of the cathode follower input at 1 is approximately 270 ohms or a little more than 1 percent of the respective output load resistors shown. The 38 kc. switching signal which alternately switches the information from one channel to the other is completely eliminated from the outputs with a very simple filter, requiring no complex circuits or careful balancing of the 38 kc. signal to ground. In fact, the signal does not need to be balanced to ground at all. However, a rough balancing is unobjectionable.

It will be seen that the switch has only four diodes, five resistors, three capacitors and two simple filters. In fact, the diodes and their output resistors and capacitors, together with the two filters, are easily mounted in the form of a printed circuit module which can be replaced at any time without requiring any balancing.

When the circuit is compared with similar circuits of the patent referred to above, bearing in mind of course that the diode pairs must be doubled in order to produce an SPDT switch, it will be seen that no tubes or extensive diode bridge are necessary, and all of these elements are eliminated without eliminating their function of removing the switching signal from the output. The same desirable result is therefore obtained with the elimination of a number of elements formerly considered necessary.

FIG. 2 illustrates a very simple circuit for mixing. Two sources of frequency F1 and F2, are shown at 5 and 6. When good silicon diodes are chosen an enormous range of accurate frequency multiplication results. For example, considering the diode formula for forward conduit in $I=I_0(e^{kv}-1)$ the current will be practically exponential over a range from 1 ma. to 400 ma., a range of about 400,000 to 1. The circuit is very simple, it requires no tubes with power supply problems or other complications, and yet precision mixing is obtained. An important advantage is that the signal sources entering the mixer need not be balanced with respect to ground, thus permitting great simplification in circuit design and increased reliability. The diodes are forward biased through the large resistor 7 so that at least a slight current flows so that the diodes are always operated in their exponential region.

I claim:

1. A mixing circuit comprising (a) two physically separate diodes connected in opposition, (b) sources of signal at two different frequencies, one connected to the end of one diode of the pair, and the other to the junction of the diodes, (c) an output circuit connected to the other end of the other diode, and (d) means for maintaining forward biases on both diodes in their exponential operating regions.

2. A mixing circuit according to claim 1 in which each signal source has one side grounded.

3. A mixing circuit according to claim 1 in which the signal circuit connected to an end of a diode is of low impedance and the signal circuit connected to the junction of the diodes is of high impedance.

References Cited by the Examiner

UNITED STATES PATENTS

| | | | |
|---|---|---|---|
| 2,613,318 | 10/52 | Snyder | 328—15 |
| 2,651,718 | 9/53 | Levy | 328—153 |
| 3,075,085 | 1/63 | Helbig et al. | 307—88.5 X |

OTHER REFERENCES

Transistor Electronics, by Lo et al., Prentice-Hall Inc., 1955, Figs. 11–16, page 412.

Electronics and Radio Engineering, by Terman, 4th ed., McGraw-Hill Book Co. (1955), Fig. 16.22, page 578.

ARTHUR GAUSS, *Primary Examiner.*